United States Patent
Nakagawa et al.

(10) Patent No.: US 8,203,176 B2
(45) Date of Patent: Jun. 19, 2012

(54) DIELECTRIC, CAPACITOR USING DIELECTRIC, SEMICONDUCTOR DEVICE USING DIELECTRIC, AND MANUFACTURING METHOD OF DIELECTRIC

(75) Inventors: Takashi Nakagawa, Tokyo (JP); Toru Tatsumi, Tokyo (JP); Nobuyuki Ikarashi, Tokyo (JP); Makiko Oshida, Tokyo (JP)

(73) Assignee: Renesas Electronics Corporation, Kanagawa (JP)

(*) Notice: Subject to any disclaimer, the term of this patent is extended or adjusted under 35 U.S.C. 154(b) by 376 days.

(21) Appl. No.: 12/526,238

(22) PCT Filed: Feb. 4, 2008

(86) PCT No.: PCT/JP2008/051738
§ 371 (c)(1),
(2), (4) Date: Aug. 6, 2009

(87) PCT Pub. No.: WO2008/108128
PCT Pub. Date: Sep. 12, 2008

(65) Prior Publication Data
US 2010/0320520 A1 Dec. 23, 2010

(30) Foreign Application Priority Data
Mar. 8, 2007 (JP) ................. 2007-058316

(51) Int. Cl.
*H01L 21/00* (2006.01)

(52) U.S. Cl. ........ 257/310; 257/337; 257/410; 257/532; 257/647; 257/E21.01; 257/E21.013; 257/E21.038; 257/E21.257; 257/E21.274; 257/E21.577; 257/E21.647; 257/E27.048; 438/705; 438/785

(58) Field of Classification Search ............. 257/310, 257/337, 410, 532, 647, E21.001, 13, 38, 257/257, 274, 285, 507, 577, 27.048; 438/705, 438/778–785
See application file for complete search history.

(56) References Cited

U.S. PATENT DOCUMENTS

| | | | |
|---|---|---|---|
| 6,207,589 B1* | 3/2001 | Ma et al. | 438/785 |
| 7,678,704 B2* | 3/2010 | Klee et al. | 438/705 |
| 7,825,043 B2* | 11/2010 | Lee | 438/785 |
| 2002/0197881 A1 | 12/2002 | Ramdani et al. | |
| 2005/0009281 A1* | 1/2005 | Lim et al. | 438/287 |

FOREIGN PATENT DOCUMENTS

JP    2001077111 A    3/2001
(Continued)

OTHER PUBLICATIONS

International Search Report for PCT/JP2008/051738 mailed Apr. 22, 2008.

(Continued)

*Primary Examiner* — Michael S Lebentritt
(74) *Attorney, Agent, or Firm* — Sughrue Mion, PLLC

(57) ABSTRACT

To make it possible to significantly suppress the leakage current in a semiconductor device having a capacitor structure using a dielectric film. There is provided a composite oxide dielectric which is mainly composed of Zr, Al and O, and which has a composition ratio of Zr and Al in a range of (1−x):x where $0.01 \leq x \leq 0.15$, and has a crystal structure. When the dielectric is set to have the Al composition in the above described range and is crystallized, the relative dielectric constant of the dielectric can be significantly increased. When the dielectric is used as a dielectric film of a capacitor of a semiconductor device, the leakage current of the capacitor can be significantly reduced.

27 Claims, 12 Drawing Sheets

Dielectric film:
$Zr_{(1-x)}Al_xO_y$ having Al composition in a range of $0.01 \leq x \leq 0.15$ and crystallized

FOREIGN PATENT DOCUMENTS

| | | | |
|---|---|---|---|
| JP | 2002033320 | A | 1/2002 |
| JP | 2002222934 | A | 8/2002 |
| JP | 2002373945 | A | 12/2002 |
| JP | 2004161602 | A | 6/2004 |
| JP | 2004214304 | A | 7/2004 |
| KR | 10-0670747 | A | 1/2007 |

OTHER PUBLICATIONS

S. B. Qadri, "Phase stability of ZrO2-Al2O3 thin films deposited by magnetron sputtering", Physical Review B vol. 39, No. 9. p. 6234-6237(1989).

W.F.A. Besling et al., "Characterisation of ALCVD Al2O3-ZrO2 nanolaminates, link between electrical and structural properties", Journal of Non-Crystalline Solids, May 2002, vol. 303, No. 1, pp. 123-133.

M. Zhu et al., "Microstructure and electrical properties of Al2O3-ZrO2 composite films for gate dielectric applications", Thin Solid Films, Apr. 8, 2005, vol. 476, No. 2, pp. 312-316.

K. Kita et al., "Permittivity increase of yttrium-doped HfO2 through structural phase transformation", Applied Physics Letters 86,102906(2005).

* cited by examiner

Dielectric film:
$Zr_{(1-x)}Al_xO_y$ having Al composition in a range of $0.01 \leq x \leq 0.15$ and crystallized (c)

(d)

(g)

(h)

(i)

(j)

(k)

DIELECTRIC, CAPACITOR USING DIELECTRIC, SEMICONDUCTOR DEVICE USING DIELECTRIC, AND MANUFACTURING METHOD OF DIELECTRIC

This application is the National Phase of PCT/JP2008/051738, filed Feb. 4, 2008, which is based upon and claims the benefit of priority from Japanese Patent Application No. 2007-058316 filed in Japan on Mar. 8, 2007, the entire content of which is hereby incorporated by reference in the application and claims of the present application.

TECHNICAL FIELD

The present invention relates to a dielectric and a semiconductor device using the dielectric.

DESCRIPTION OF THE RELATED ART

In the development of semiconductor devices having higher element density and integration, miniaturization of the respective elements has been advanced and the operating voltage has been reduced. For example, in the field of advanced DRAM (Dynamic Random Access Memory) devices, the occupation area of a capacitor constituting a memory cell has been reduced along with the miniaturization of the memory cell. When the capacitance of the capacitor is not sufficient, the charge of the capacitor is reduced under the influence of an external noise signal, and the like, so that the device tends to malfunction so as to cause an error as represented by a software error. Further, in a MOS transistor, as the thickness of the gate insulating film is reduced along with the miniaturization of the transistor, the tunnel leakage current which flows from the gate electrode to the substrate is increased to a non-negligible level.

The capacitance of a capacitor constituting a memory cell of an advanced DRAM device is proportional to the surface area of electrodes and the relative dielectric constant of a dielectric, and is inversely proportional to the distance between the electrodes. Therefore, in order to realize a memory cell capacitor required for the advanced DRAM device, it is necessary to use a dielectric film whose relative dielectric constant is high and whose film thickness can be reduced without increasing the leakage current.

Also, in the gate insulating film constituting a MOS transistor, it is necessary to use an insulating film whose relative dielectric constant is high and whose film thickness can be reduced without increasing the leakage current.

As a method for increasing the capacitance of the DRAM capacitor, there has been investigated a method to use, as a capacitance insulating film, a film which is made of $HfO_2$, $ZrO_2$, or $Al_2O_3$, which have relative dielectric constants higher than that of the conventional films, such as the $SiO_2$ film, the SiN film, or the SiON film formed by combining the $SiO_2$ film and the SiN film. Further, in recent years, in order to suppress the increase in the leakage current due to the reduction in the thickness of the capacitance insulating film, there has been investigated a laminated structure of films respectively made of $HfO_2$, $ZrO_2$ and $Al_2O_3$, and a capacitance insulating film formed by doping a metal element into $HfO_2$ or $ZrO_2$.

For example, in Patent Documents 1 and 2, there is described a capacitance insulating film material in which aluminum (Al), scandium (Sc), lanthanum (La), or the like, is doped as a metal element into $HfO_2$ or $ZrO_2$. In Patent Documents 1 and 2, it is described that the electron affinity of the dielectric material is changed by doping the above described metal element into $HfO_2$ or $ZrO_2$, so as to thereby change the electron barrier height and the hole barrier height. It is also described that the formation of crystal structure is reduced or prevented by the existence of the doped metal, so that an amorphous dielectric material tends to be formed. In Patent Documents 1 and 2, it is described that the relative dielectric constant value of the dielectric material is in the range of 10 to 25.

In Patent Document 3, there is disclosed, as a capacitance insulating film, an amorphous film which has amorphous aluminum oxide contained in a crystalline dielectric and which is formed of $Al_xM(1-x)O_y$ having a composition in the range of $0.05<x<0.3$ (where M denotes a metal, such as Hf and Zr, capable of forming a crystalline dielectric). This technique has a feature of preventing the breakdown of a capacitance insulating film based on amorphous zircon aluminate, while maintaining a high relative dielectric constant of 25 to 28. Further, in Patent Document 3, it is described that the relative dielectric constant of $ZrO_2$ is 30.

In Non-patent Document 1, it is described that when an amorphous $ZrO_2$—$Al_2O_3$ thin film manufactured by magnetron sputtering is annealed at 1000° C., the amorphous thin film is formed in a tetragonal or monoclinic crystal structure. In Non-patent. Document 1, it is described that when the atomic ratio of Zr to Al is 76:24, the amorphous thin film is formed in the monoclinic crystal structure, and that when the atomic ratio of Zr to Al is 52:48, the amorphous thin film is dominantly formed in the tetragonal crystal structure. However, their relative dielectric constant values are not disclosed.

Patent Document 1: Japanese Patent Laid-Open No. 2002-33320
Patent Document 2: Japanese Patent Laid-Open No. 2001-77111
Patent Document 3: Japanese Patent Laid-Open No. 2004-214304
Non-patent document 1: PHYSICAL REVIEW B 39-9, p. 6234-6237 (1989)

DISCLOSURE OF THE INVENTION

Problems to be Solved by the Invention

However, the above described techniques have following problems, respectively.

In the technique described in Patent Documents 1 and 2, in which the electron affinity of a dielectric material, and the electron barrier height and the hole barrier height in the dielectric material are changed by doping aluminum (Al), scandium (Sc), lanthanum (La), or the like as a metal element, into $HfO_2$ or $ZrO_2$, the achievable relative dielectric constant of the capacitance insulating film is reduced to the range of 10 to 25, which range is lower than the range of the relative dielectric constant of the non-doped capacitance insulating film. For this reason, it is not possible to obtain the leakage current suppressing effect based on the increase in the relative dielectric constant.

In the technique described in Patent Document 3, which makes Al contained in $ZrO_2$ in the range of 5 to 30% so as to form an amorphous film, the relative dielectric constant of $ZrO_2$ is reduced, due to the doping of Al, to the range of 25 to 28, which range is lower than the range of the relative dielectric constant obtained in the case where the doping is not performed. For this reason, it is not possible to obtain the leakage current suppressing effect based on the increase in the relative dielectric constant.

In the case of the film which is described in Non-patent Document 1 and which is formed by crystallizing a $ZrO_2$—$Al_2O_3$ amorphous thin film by annealing at 1000° C., it is not known what kind of crystal is formed in a composition other than the above described composition, and what relative dielectric constant value is obtained.

Therefore, it is an object of the present invention to provide a dielectric whose relative dielectric constant is high and whose film thickness can be reduced without causing an increase in the leakage current, and to provide a capacitor and a semiconductor device which use the dielectric.

Means for Solving the Problems

In order to achieve the above described object, according to the present invention, there is provided a composite oxide dielectric which is mainly composed of Zr, Al and O, and which has a Zr to Al composition ratio of (1−x):x where $0.01 \leq x \leq 0.15$, and has a crystal structure.

Further, according to the present invention, there is provided a capacitor including a first electrode, a second electrode, and a layer which is sandwiched between the first electrode and the second electrode and which includes a dielectric, the capacitor being characterized in that the dielectric is the dielectric according to the present invention.

Further, according to the present invention, there is provided a semiconductor device which includes a dielectric as an insulator, and which is characterized in that the dielectric is the dielectric according to the present invention.

Further, according to the present invention, there is provided a semiconductor device which has a capacitor, and which is characterized in that the capacitor is the capacitor according to the present invention.

Further, according to the present invention, there is provided a manufacturing method of a composite oxide dielectric which is mainly composed of Zr, Al and O, and which has a Zr to Al composition ratio of (1−x):x where $0.01 \leq x \leq 0.15$, and has a crystal structure, the manufacturing method including: a first process of forming a precursor by depositing, onto a substrate, a film mainly composed of Zr, Al and O; and a second process of forming the precursor into the dielectric by heat-treating the precursor.

Further, according to the present invention, there is provided the manufacturing method of the dielectric characterized in that the first process is performed by sputtering.

Advantages of the Invention

According to the present invention, there is provided a dielectric which is mainly composed of Zr, Al and O, and which has a Zr to Al composition ratio of (1−x):x where $0.01 \leq x \leq 0.15$, and has a crystal structure. By setting the composition of Al in the above described range and crystallizing the dielectric, it is possible to obtain a dielectric having a significantly high relative dielectric constant. Therefore, in a semiconductor device having a capacitor structure using the dielectric film according to the present invention, it is possible to significantly suppress the leakage current.

Further, the capacitor having the capacitance insulating film according to the present invention can be formed by a heat treatment process at a temperature of 600° C. or less. Thus, even when the capacitor is applied to a DRAM and a logic mixed DRAM, in which a silicide layer is used in the gate electrode and the source and drain diffusion regions, it is possible to prevent the deterioration of transistor characteristics due to the increase in the resistance value of the silicide layer, which increase is caused when high temperature processing is performed at a temperature higher than 600° C. Thereby, it is possible reduce EOT (Equivalent Oxide Thickness that means an $SiO_2$ equivalent film thickness), without causing an increase in the leakage current of the DRAM cell mounted in the memory section.

DESCRIPTION OF SYMBOLS

Figure 1:
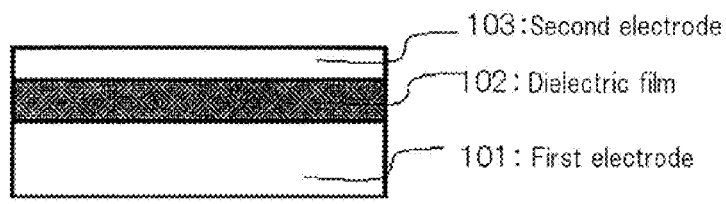
FIG. 1 is a figure showing a cross section of an element structure of an exemplary embodiment.

1 P-type silicon substrate
2 Element isolation region
3 Gate oxide film
4 Gate electrode
5 N-type diffusion region
6 First interlayer insulating film
7 Contact hole
8 TiN film
9 W film
10 Memory selection transistor
11 Capacitive contact
12 Bit contact
13 Stopper insulating film
14 Second interlayer insulating film
15 Cylinder groove 16 First electrode
17 Dielectric film
18 Second electrode
19 Capacitor
20 Capacitor wire
21 Opening section
22 Third interlayer insulating film
23 Contact hole
24 TiN film
25 Bit wire
26 Polycrystalline silicon layer (including n-type impurity)
27 Tungsten layer
28 Nickel silicide layer
29 Polycrystalline silicon layer (including n-type impurity)
30 Nickel silicide layer
31 Nickel silicide layer
101 First electrode
102 Dielectric film
103 Second electrode
104 Silicon substrate
105 Natural oxide film
106 Film containing Zr, Al and O
107 Second electrode
201 TiN electrode
202 Dielectric film
203 TiN electrode
304 Silicon substrate
305 Natural oxide film
306 Zr(1−X)AlxOy film
401 Silicon substrate
402 Element isolation region
403 Silicon thermal oxide film
404 Zr(1−X)AlxOy film
405 Polysilicon
406 Extension diffusion layer region
407 Gate side wall
408 Source and drain diffusion layers

BEST MODE FOR CARRYING OUT THE INVENTION

In the following, exemplary embodiments will be described in detail with reference to the accompanying drawings.

FIG. 1 shows a sectional view of an element structure in which a dielectric according to the present invention is used. The relative dielectric constant of a composite oxide dielectric $Zr(1-x)Al_xO_y$ according to the present invention, which is mainly composed of Zr, Al and O as shown in FIG. 1, can be significantly increased by optimizing the Al composition and crystallizing the dielectric. The present invention is also based on the new finding that the leakage current of a capacitor using the dielectric according to the present invention can be significantly reduced.

This phenomenon will be explained by taking, as examples, electrical characteristics of an MIS capacitor structure in which a $Zr(1-x)Al_xO_y$ film is formed on a silicon substrate having a silicon natural oxide film on the surface thereof.

Figure 2:
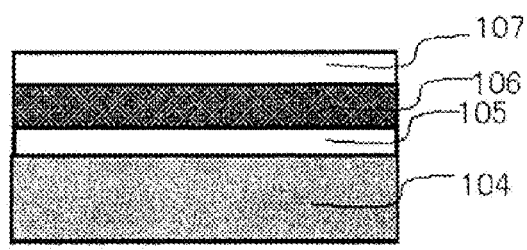
FIG. 2 is a figure showing a cross section of the element structure of the exemplary embodiment.

As shown in FIG. 2, a film 106 mainly composed of Zr, Al and O was deposited by magnetron sputtering using a target made of Zr and Al onto a silicon substrate 104 having a natural oxide film 105 on the surface thereof. The temperature of the substrate was set at 300° C. A sample was also manufactured by depositing $ZrO_2$ by using a target not containing Al.

Next, a $Zr(1-x)Al_xO_y$ film with Al uniformly diffused in $ZrO_2$ and crystallized was manufactured in the film thickness range of 2 nm to 20 nm by annealing the mixture of the film 106 mainly composed of Zr, Al and O at a temperature of 600° C. in an oxygen atmosphere. Note that the annealing was performed in the oxygen atmosphere here, but inert gas, such as nitrogen and Ar, can also be suitably used. Further, the annealing may also be performed in an atmosphere of a mixed gas containing these gases. A desired composition x is determined by the mixing ratio of Zr and Al in the target. Further, the anneal treatment can generally cause oxygen deficiency, and hence the composition y can be set as $y \leq 2-0.5x$. However, when the lower limit of the composition y is set as $1 \leq y$, it is possible to obtain the effect of the present invention as will be described below. Similarly, $ZrO_2$ was also annealed at a temperature of 600° C. in the oxygen atmosphere.

Next, Ti was vapor-deposited by a vacuum deposition method in a thickness of 100 nm onto the $Zr(1-x)Al_xO_y$ film and the $ZrO_2$ film, each of which was subjected to the anneal treatment, and thereby a first capacitor and a second capacitor were formed, respectively. Here, it is assumed that the silicon substrate is the first electrode and that Ti is the second electrode 107. Note that a third capacitor and a fourth capacitor were also formed by depositing the second electrode onto a $Zr(1-x)Al_xO_y$ film and a $ZrO_2$ film, each of which was not subjected to the anneal treatment.

Figure 3:
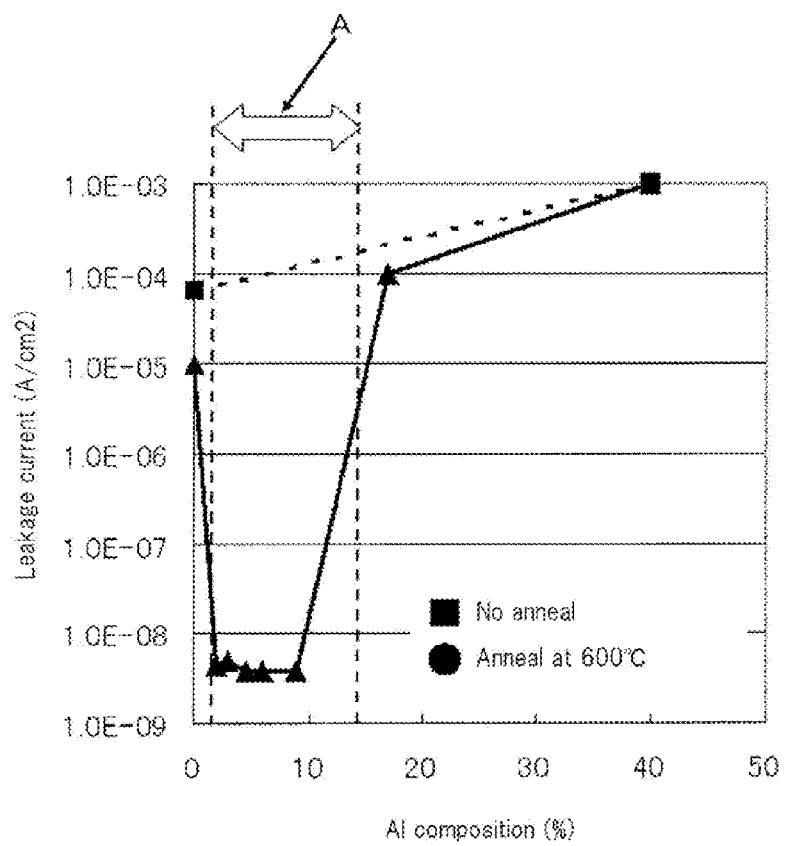
FIG. 3 is a figure showing electrical characteristics of the exemplary embodiment.

Next, the electrical characteristics of the first capacitor and the third capacitor were measured. First, the EOT of the element was evaluated by CV measurement by applying a voltage to the first electrode, with the result that the EOT=1.3 nm. Here, the EOT (Equivalent Oxide Thickness) means a value obtained by converting a physical thickness of a dielectric film into an electric film thickness equivalent to an $SiO_2$ film. In consideration of the influence of the surface potential on the I-V characteristic due to the difference in the insulating film thickness, the measurement of electrical characteristics was performed by measuring the leakage current at the time when a voltage of (Vfb−1) V was applied to the upper electrode on the basis of a flat band voltage Vfb obtained from the CV characteristic of the MIS structure. FIG. 3 shows a relationship between the leakage current and Al composition in the first capacitor and a relationship between the leakage current and Al composition in the third capacitor. It can be seen from FIG. 3 that the leakage current can be significantly reduced in the composition range of $0.02 \leq x \leq 0.10$ by performing the anneal treatment, and that the leakage current of $1.0 \times 10^{-8}$ A/cm$^2$ or less is obtained.

Subsequently, the measurement of electrical characteristics of the second capacitor and the fourth capacitor was similarly performed. The results are shown in FIG. 3 together with the above described measurement results. It can be seen from FIG. 3 that in the case of the capacitor using the $ZrO_2$ film, the leakage current is not changed before and after the annealing, and that the leakage current before and after the annealing is approximately $1.0 \times 10^{-5}$ A/cm$^2$.

From the above, it is seen that the significant reduction in the leakage current was effected in the case where the Al composition was set in the range of $0.02 \leq x \leq 0.10$, and where the annealing was performed.

Figure 4:
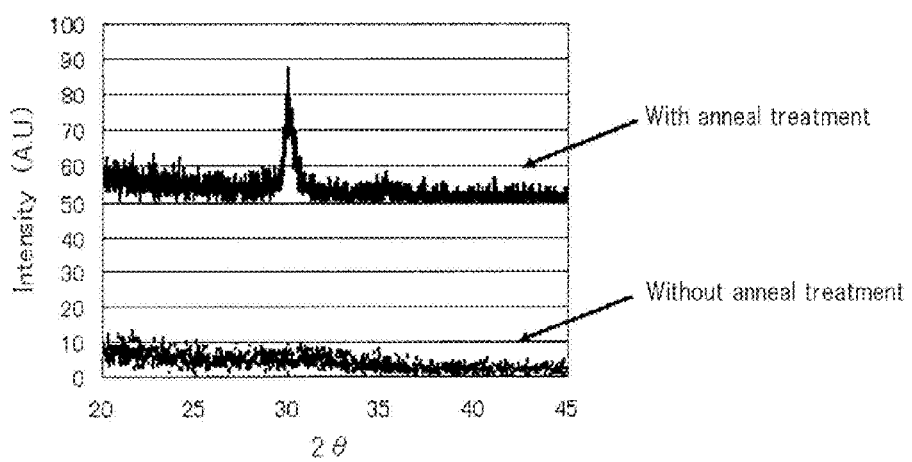
FIG. 4 is a figure showing XRD diffraction spectra of the exemplary embodiment.
Figure 5:
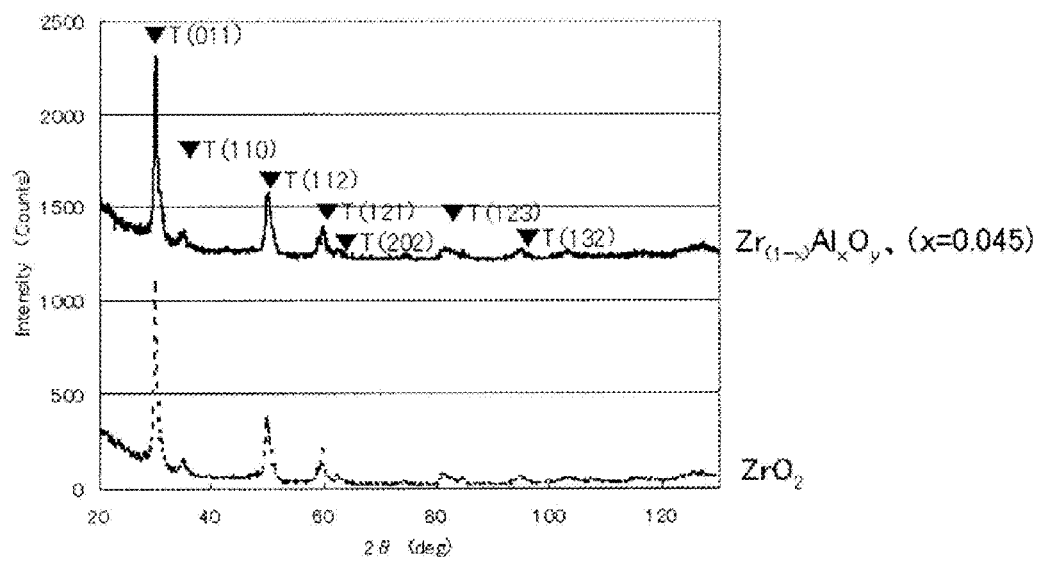
FIG. 5 is a figure showing XRD diffraction spectra of the exemplary embodiment.

Next, FIG. 4 shows XRD diffraction spectra of $Zr(1-x)Al_xO_y$ film in the case of x=0.05, before and after the annealing. FIG. 5 shows respective XRD diffraction spectra of $Zr(1-x)Al_xO_y$ film and $ZrO_2$ film after the annealing. It can be seen from FIG. 4 that the $Zr(1-x)Al_xO_y$ film is in an amorphous state immediately after the film formation, and is crystallized by being subjected to the annealing. It was found out that the crystal structure is tetragonal. Further, it can be seen from FIG. 5 that there is no significant difference in the XRD spectrum between the $Zr(1-x)Al_xO_y$ film and the $ZrO_2$ film, and that there is no effect of the Al incorporation on the crystal phase of the $ZrO_2$ film. It was found out that the crystal structure of the $ZrO_2$ film is also tetragonal. From the above results, it can be seen that the characteristic improvement due to the Al incorporation is not effected by the change in crystal phase.

It can be seen from the above that the effects of the present invention were brought about by the addition of the predetermined amount of Al and the crystallization from the amorphous state by the annealing.

As can be seen from FIG. 3, the leakage current less than $1.0 \times 10^{-5}$ A/cm$^2$ is obtained in the Al composition range of $0.01 \leq x \leq 0.15$ (which range is denoted by reference character A in FIG. 3). In order to obtain the significantly low leakage current of $1.0 \times 10^{-8}$ A/cm$^2$ or less, it is preferred that the upper limit of the composition of Al is set in the range of $x \leq 0.10$, and that the lower limit of the composition of Al is set in the range of $0.02 \leq x$.

Next, dielectric constants of the $Zr(1-x)Al_xO_y$ film and the $ZrO_2$ film which were used in the first to fourth capacitors were measured. From the measurement results, it was found that the relative dielectric constant was about 30 in the $Zr(1-x)Al_xO_y$ film before the annealing, the $ZrO_2$ film before the annealing, and the $ZrO_2$ film after the annealing, in each of which films the effect of reducing the leakage current was not obtained. On the other hand, it was found out that that in the $Zr(1-x)Al_xO_y$ ($0.01 \leq x \leq 0.15$) film crystallized by the annealing, in which film the effect of reducing the leakage current was obtained, the relative dielectric constant was in the range of 40 to 70, which range is significantly larger than the relative dielectric constant of the $Zr(1-x)Al_xO_y$ film in the amorphous state. As a result, it was proved that the effect of reducing the leakage current is brought about by the remarkable increase in the relative dielectric constant of the crystallized $Zr(1-x)Al_xO_y$ film.

Next, a $Zr(1-x)Al_xO_y$ film was manufactured in such a manner that a $ZrO_2$—$Al_2O_3$ mixture film-formed by the above described method was annealed at 400° C. in an oxygen atmosphere.

Figure 6:
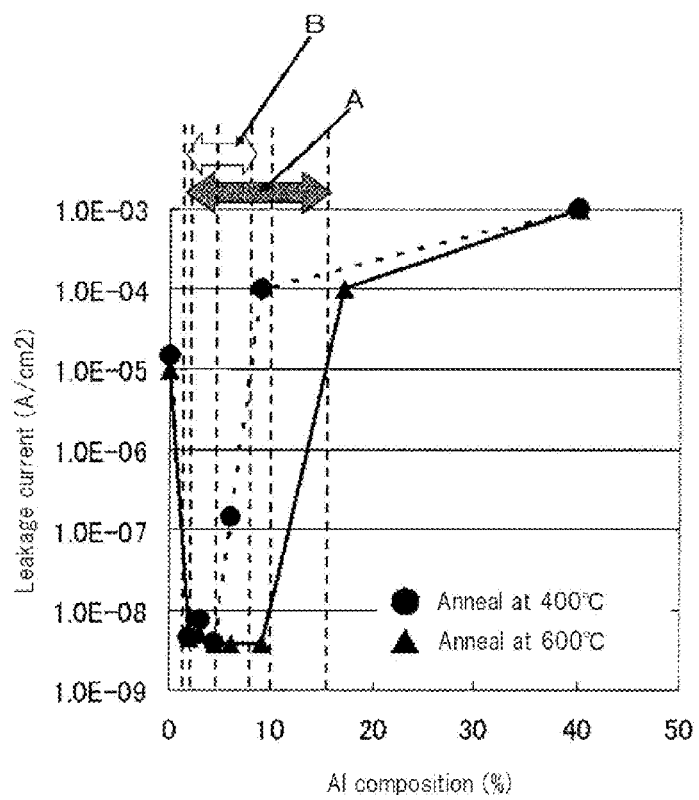
FIG. 6 is a figure showing electrical characteristics of the exemplary embodiment.

FIG. 6 shows a relationship between the leakage current and the Al composition of $Zr(1-x)Al_xO_y$ film which was formed on the natural oxide film so as to have a film thickness (EOT) of 1.3 nm and which was annealed at 400° C., together with the results shown in FIG. 3 in the case where the annealing was performed at 600° C. It can be seen from FIG. 6 that in the case of the annealing at 400° C., the leakage current is significantly reduced in the composition range of $0.01 \leq x \leq 0.08$ (which is denoted by reference character B in FIG. 6). In particular, it can be seen that the leakage current of $1.0 \times 10^{-8}$ A/cm$^2$ or less is obtained in the case where the upper limit of the Al composition is set in the range of $x \leq 0.05$, and where the lower limit of the Al composition is set in the range of $0.02 \leq x$. That is, it was found out that also in the case of annealing at 400° C., the leakage current is significantly reduced in a desired range of Al composition, although the range is not so wide as the range (denoted by reference character A in FIG. 6) in the case of annealing at 600° C.

The XRD diffraction spectrum of the $Zr(1-x)Al_xO_y$ film having the Al composition of $x=0.05$ and annealed at 400° C. was similar to the XRD diffraction spectra as shown in FIGS. 4 and 5. That is, it was found out that the effect of reducing the leakage current is obtained by the addition of the predetermined amount of Al and the crystallization from the amorphous state by the annealing. Further, when the relative dielectric constant of the $Zr(1-x)Al_xO_y$ ($0.01 \leq x \leq 0.08$) film crystallized by the annealing at 400° C. was evaluated, there was obtained a value in the range of 40 to 70 similarly to the case of annealing at 600° C.

Figure 7:
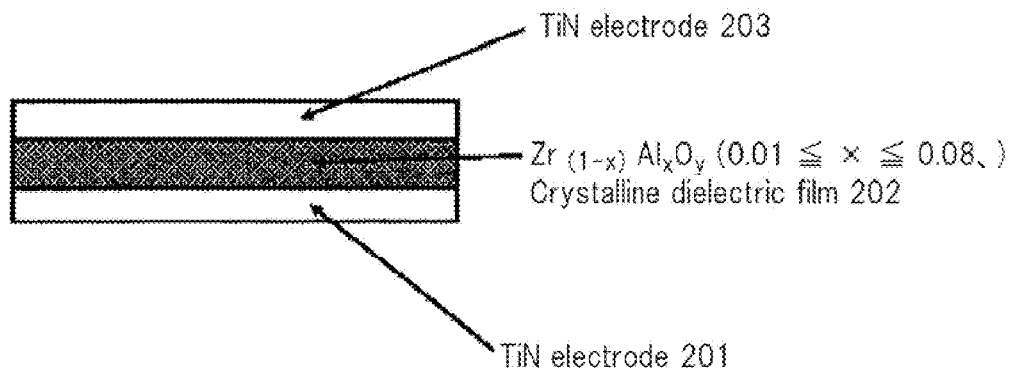
FIG. 7 is a figure showing a cross section of the element structure of the exemplary embodiment.

Further, the effects of the present invention were also obtained in the MIM structure as shown in FIG. 7, in which TiN was used as the material of the two electrodes. It was confirmed that in the case of the MIM structure, a silicon natural oxide film is not formed, and hence the EOT can be reduced as compared with the EOT in the case of the MIS structure. In this case, there was obtained the characteristic of the leakage current of $5.0 \times 10^{-9}$ A/cm$^2$ when a voltage difference of 1 V was applied between the electrodes with EOT=0.6 nm. This effect was similarly obtained, even when a material selected from a group including Ti, W, WN, Pt, Ir and Ru was used as the material of the two electrodes.

As described above, the $Zr(1-x)Al_xO_y$ dielectric film according to the present invention is crystallized and has a composition in the range of $0.01 \leq x \leq 0.15$. In order to obtain a significant effect of reducing the leakage current, it is preferred that when being crystallized at the annealing temperature of 600° C., the dielectric film has the composition in the range of $0.02 \leq x \leq 0.10$, and that when being crystallized at the annealing temperature of 400° C., the dielectric film has the composition in the range of $0.02 \leq x \leq 0.05$.

Note that the dielectric according to the present invention may be mainly composed of Zr, Al and O so as to have the Zr to Al composition ratio of $(1-x):x$ where $0.01 \leq x \leq 0.15$, and the composition ratio of the sum of Zr and Al to the total of metal elements contained in the dielectric may be 99% or more. That is, even in the case where the other metal elements, such as Y, are contained, if the ratio of the elements to the total metal elements is less than 1%, it is possible to obtain the effect of the present invention. Note that the metal element here also includes an element as described as a semi-metal element, such as Si. Further, the composition ratio of oxygen to the total elements other than the metal elements contained in the dielectric may be 80% or more. When the composition ratio of oxygen is reduced to less than 80%, the dielectric is hardly crystallized even when being annealed, and thereby it is difficult to obtain the effect of significantly increasing the relative dielectric constant. That is, even in the case where the other elements, such as nitrogen, are contained, the composition ratio of the elements, such as nitrogen, to the total elements other than the metal elements contained in the dielectric may be less than 20%.

Further, even in the case of the annealing temperature of 350° C. or more to less than 400° C., it is possible to obtain the effect of reducing the leakage current by the crystallization. Further, even in the case of the annealing temperature of 600° C. or more, it is possible to obtain the effect that the relative dielectric constant is significantly increased by the crystallization. However, the deterioration of the electrode, and the like, tends to be caused by the annealing, and hence the annealing temperature less than 1000° C. is practical.

Note that in the above description, there are described the laminated structure of the silicon natural oxide film and the $Zr(1-x)Al_xO_y$ film, and a single film structure of the $Zr(1-x)Al_xO_y$ film, but the present invention is not limited to these. When the $Zr(1-x)Al_xO_y$ film satisfying the conditions of the present invention is included in a part of a capacitance insulating film, it is possible to sufficiently obtain the effect of the present invention.

As described above, according to the present invention, there is provided a composite oxide dielectric which is mainly composed of Zr, Al and O, and which has a Zr to Al composition ratio of $(1-x):x$ where $0.01 \leq x \leq 0.15$, and has a crystal structure.

Further, it is preferred that the dielectric expressed by Zr(1−x)AlxOy according to the present invention has a composition of Zr, Al and O in the range of $0.01 \leq x \leq 0.15$ and $1 \leq y \leq 2-0.5x$.

Further, it is preferred that the dielectric expressed by Zr(1−x)AlxOy according to the present invention has a composition of Zr, Al and O in the range of $0.02 \leq x \leq 0.10$ and $1 \leq y \leq 2-0.5x$.

Further, it is preferred that the dielectric expressed by Zr(1−x)AlxOy according to the present invention has a composition of Zr, Al and O in the range of $0.02 \leq x \leq 0.05$ and $1 \leq y \leq 2-0.5x$.

Further, it is preferred that the composition ratio of the sum of Zr and Al to the total of metal elements contained in the dielectric according to the present invention is 99% or more.

Further, it is preferred that the composition ratio of oxygen to the total elements other than the metal elements contained in the dielectric according to the present invention is 80% or more.

According to the present invention, it is possible to provide a dielectric characterized by having a relative dielectric constant higher than that of the $ZrO_2$ crystal.

Further, according to the present invention, there is provided a dielectric characterized by having a relative dielectric constant of 40 or more.

Further, the present invention includes a capacitor configured by a first electrode, a second electrode, and a layer which is sandwiched between the first electrode and the second electrode and which includes a dielectric, the capacitor being characterized in that the dielectric according to the present invention is used as the dielectric included in the layer.

Further, it is preferred that in the capacitor according to the present invention, the above described dielectric has a thickness of 2 nm or more to 20 nm or less.

Further, in the capacitor according to the present invention, in the case where the above described dielectric has a film thickness corresponding to an $SiO_2$ equivalent film thickness of 1.3 nm or less, it is possible to reduce to $1 \times 10^{-8}$ A/cm$^2$ or less the leakage current which flows between the first electrode and the second electrode at the time when the potential difference between the first electrode and the second electrode is set to (Vfb−1) V on the basis of the flat band voltage of Vfb.

The first electrode can be selected from a group including TiN, Ti, W, Pt, Ir and Ru, while the second electrode can be selected from a group including TiN, Ti, W, Pt, Ir and Ru.

Further, in the capacitor according to the present invention, in the case where the above described dielectric has a film thickness corresponding to an $SiO_2$ equivalent film thickness of 0.6 nm or less, it is possible to reduce to $1 \times 10^{-8}$ A/cm$^2$ or less the leakage current which flows between the first electrode and the second electrode at the time when the potential difference between the first electrode and the second electrode is set to 1 V.

Further, the present invention includes a semiconductor device having, as an insulator, the dielectric according to the present invention.

Further, the present invention includes a semiconductor device having one of the above described capacitors. It is preferred that the semiconductor device according to the present invention is configured by providing the capacitor on a substrate at least whose surface is formed by a semiconductor layer.

Further, the semiconductor device according to the present invention, which includes one of the above described capacitors, and a switching element formed on a substrate at least whose surface is formed by a semiconductor layer, can be configured such that the capacitor is electrically connected to the switching element.

According to the present invention, there is provided a semiconductor device characterized in that the surface of the first electrode, which surface faces the second electrode, and the surface of the second electrode, which surface faces the first electrode, are respectively configured by a plurality of surfaces. When each of the mutually facing electrode surfaces is formed by the plurality of surfaces, it is possible to form a capacitor having a larger electrode area in a region which occupies a predetermined area on the substrate.

As the configuration in which each of the mutually facing electrode surfaces is configured by the plurality of surfaces, there is provided a semiconductor device characterized in that the surface of the first electrode which surface faces the second electrode is configured by a surface substantially in parallel with the substrate and a surface substantially vertical to the substrate, and in that the surface of the second electrode which surface faces the first electrode is configured by a surface substantially in parallel with the substrate and a surface substantially vertical to the substrate. As a capacitor provided in such semiconductor device, there can be listed, for example, a capacitor having a cylinder structure.

Further, a semiconductor device according to the present invention, which has a source region and a drain region on a substrate at least whose surface is formed by a semiconductor layer, and which has a gate electrode on the substrate via an insulating film, can be configured such that the insulating film is a film including a thin film made of one of the above described dielectrics.

Further, according to the present invention, there is provided a manufacturing method of a composite oxide dielectric which is mainly composed of Zr, Al and O, and which has a Zr to Al composition ratio of (1−x):x where $0.01 \leq x \leq 0.15$, and has a crystal structure, the manufacturing method including: a first process of forming a precursor by depositing on, a substrate a film mainly composed of Zr, Al and O; and a second process of forming the precursor into the above described dielectric by heat-treating the precursor.

The first process can be performed by sputtering. The first process can be performed by an atomic layer deposition method or a chemical vapor deposition method.

The first process can include: a process a of forming an oxide layer mainly composed of Zr and Al; and a process b of forming an oxide layer mainly composed of Zr. Further, the first process may include a plurality of number of times of the process a, and a plurality of number of times of the process b.

Further in the second process, the layer formed by the process a, and the layer formed by the process b can be made uniform in composition.

It is preferred that the second process is performed by heat treatment at a temperature of 350° C. or more.

Further, the second process can be performed in an atmosphere of one of oxygen, nitrogen and an inert gas, or in a mixed gas atmosphere of these gases.

EXAMPLE

Example 1

Example 1 will be described in detail with reference to the accompanying drawings.

Figure 8:
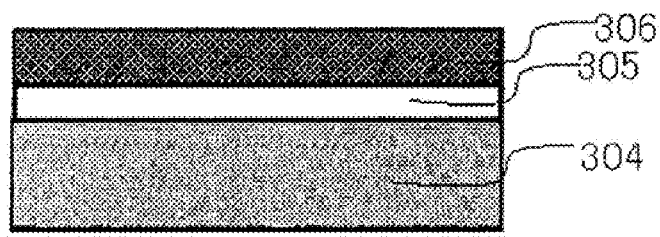
FIG. 8 is a figure showing a cross section of an element structure of Example 1.
Figure 9:
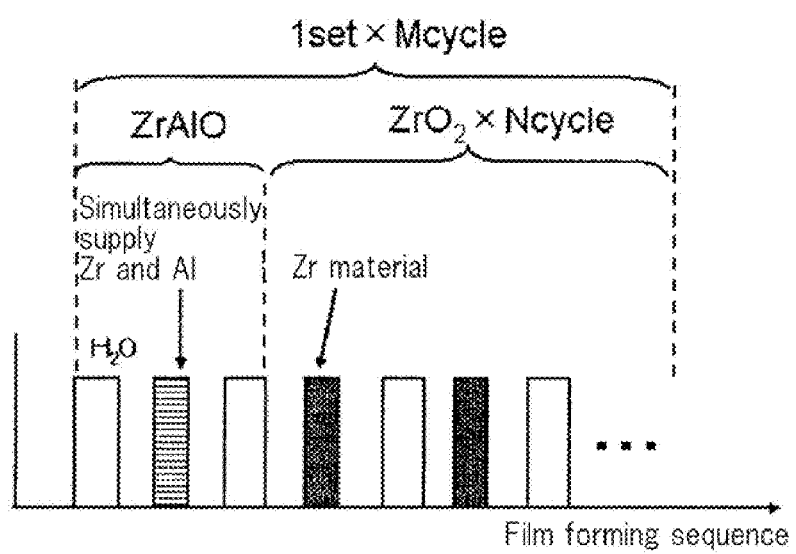
FIG. 9 is a figure showing a supply process of material gases in Example 1.

FIG. 8 is a figure showing a dielectric according to Example 1. On a silicon substrate 304 having a natural oxide film 305 on the surface thereof, a Zr(1−x)AlxOy film 306 was formed as a metal oxide layer in a thickness range of 2 nm to 20 nm by a CVD (Chemical Vapor Deposition) method or an ALD (Atomic Layer Deposition) method. The substrate temperature was set to 300° C., and trimethylaluminum (Al(CH$_3$)$_3$) and tetrakis diethylamino zirconium (Zr(NEt$_2$)$_4$) were used as organic metal materials, and H$_2$O was used as an oxidizing agent. The film forming method can be set by controlling the partial pressure of the introduced oxidizing agent. When the partial pressure of the oxidizing agent is set high, the CVD method is used, while when the partial pressure of the oxidizing agent is set low, the ALD method is used. When metal material gas and oxidization material are simultaneously supplied, the film can be formed by the CVD method. FIG. 9 shows the outline of the material gas supply process in the exemplary embodiment. As shown in FIG. 9, the material gas supply process in the present invention includes a forming process of a metal oxide layer made of Zr and Al (hereinafter described as ZrAlO film), and a forming process of a ZrO$_2$ film. In the forming process of the ZrAlO film, H$_2$O as the oxidizing agent is supplied onto the substrate. H$_2$O is supplied at a flow rate of 5 sccm for 2 seconds by a mass flow controller. Here, ccm is cc (cm$^3$)/min, that is, the unit for specifying the flow rate per one minute, and sccm is standard cc/min, that is, ccm under the standard conditions of 1 atm and 0° C.

Figure 10:
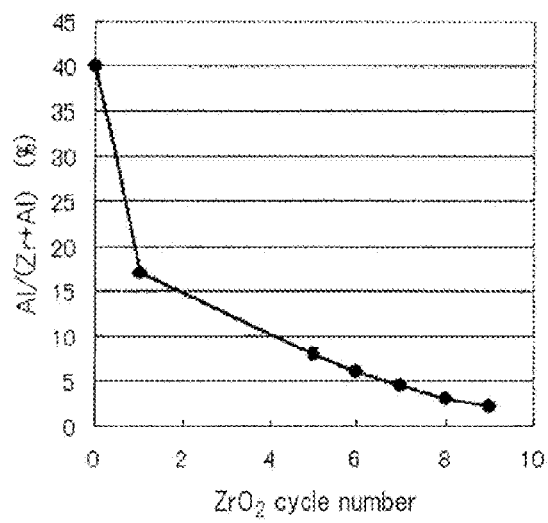
FIG. 10 is a figure showing the dependency of the composition of Zr(1−x)AlxOy film of Example 1 on the $ZrO_2$ forming cycle.
Figure 11:
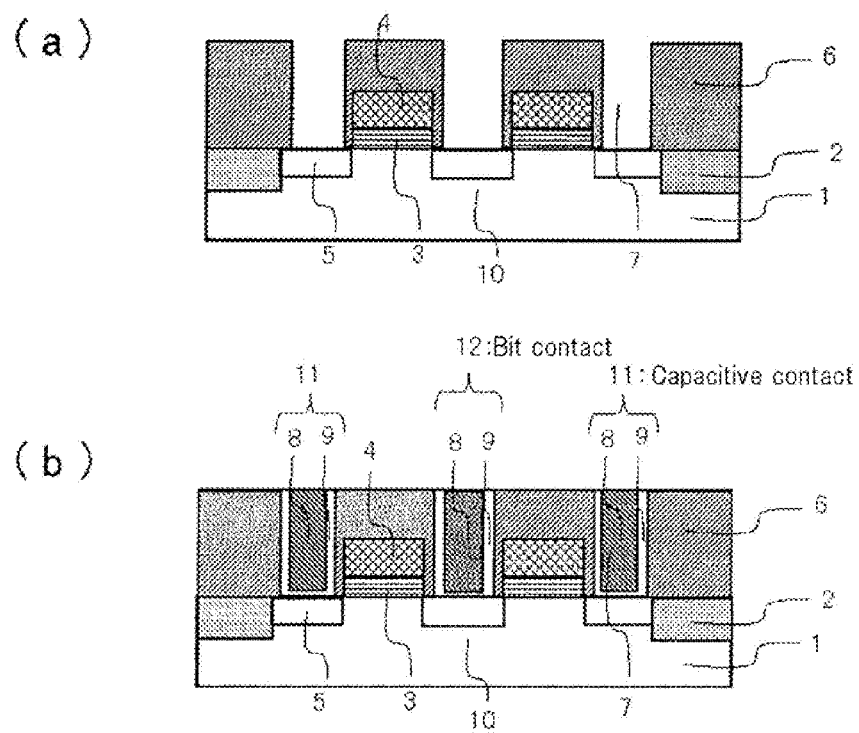
FIG. 11 is a figure showing processes of a manufacturing method of a semiconductor device of Example 3.
Figure 12:
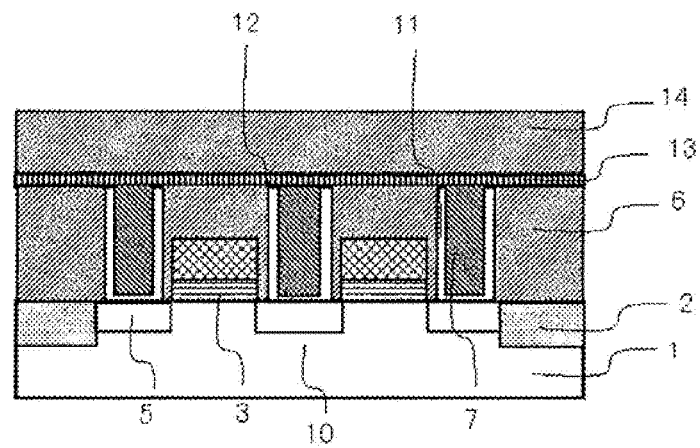
FIG. 12 is a figure showing processes of the manufacturing method of the semiconductor device of Example 3.
Figure 12:
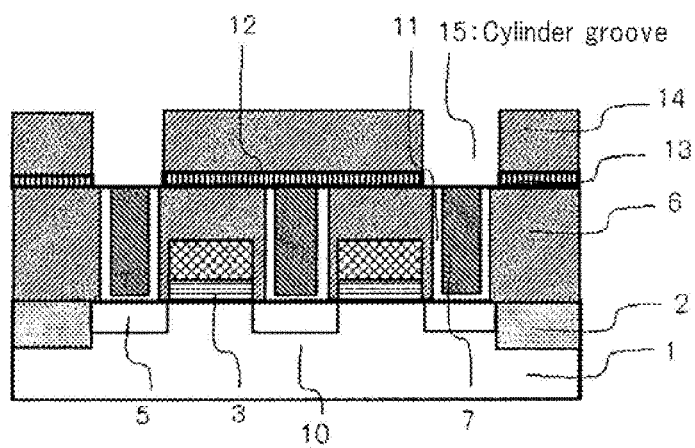
Figure 13:
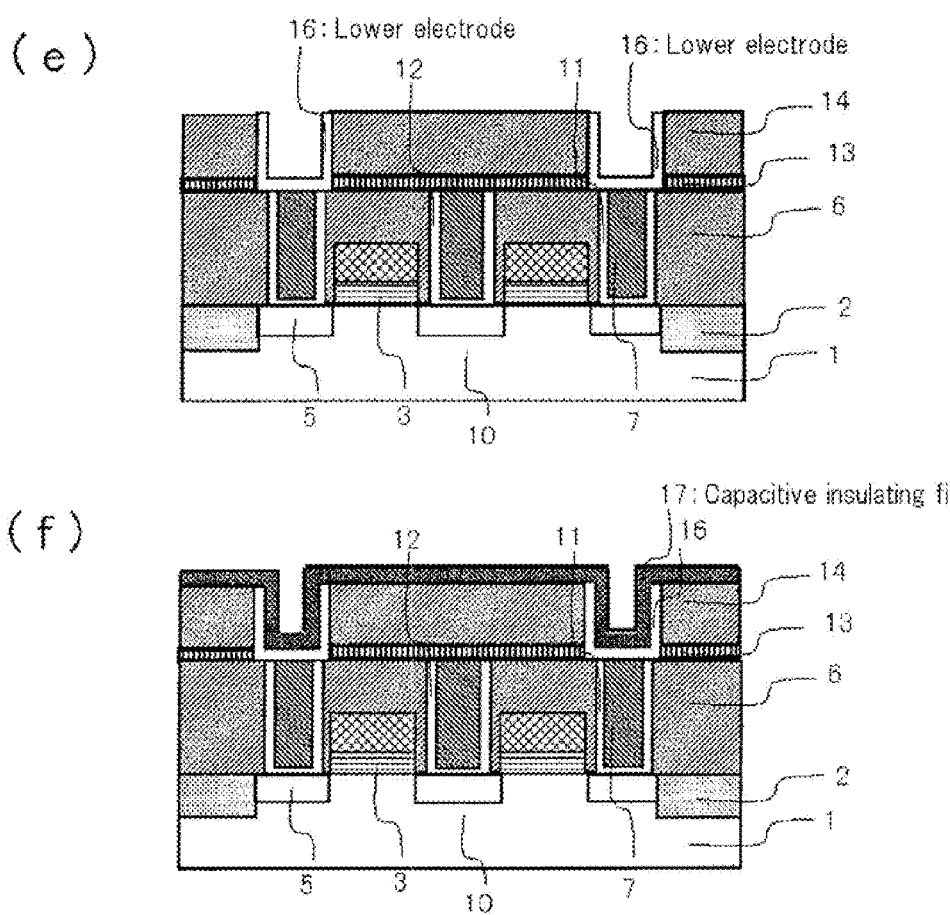
FIG. 13 is a figure showing processes of the manufacturing method of the semiconductor device of Example 3.
Figure 14:
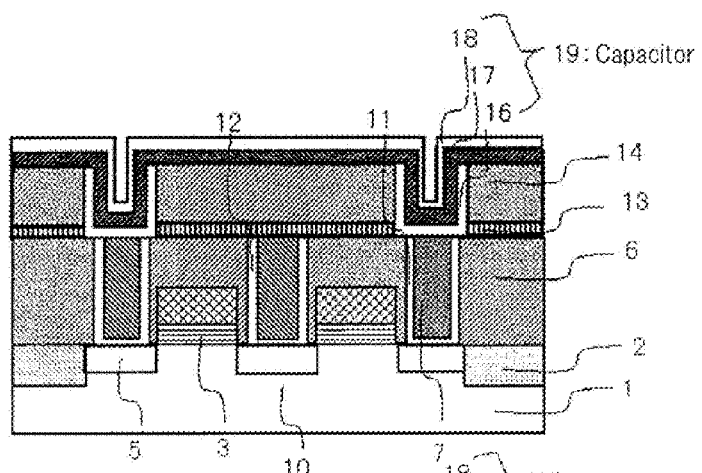
FIG. 14 is a figure showing processes of the manufacturing method of the semiconductor device of Example 3.
Figure 14:
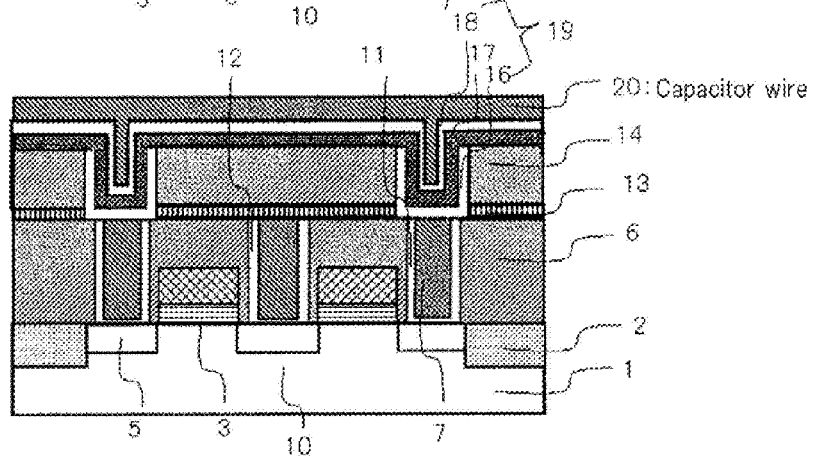
Figure 15:
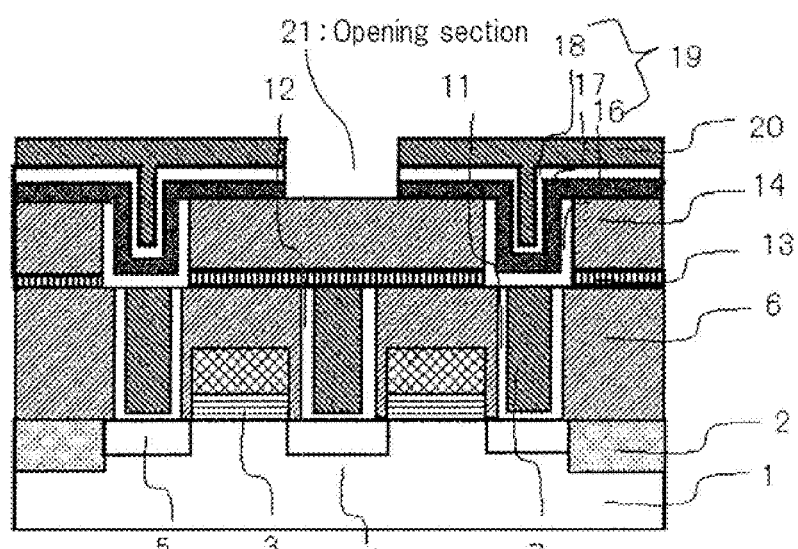
FIG. 15 is a figure showing processes of the manufacturing method of the semiconductor device of Example 3.
Figure 15:
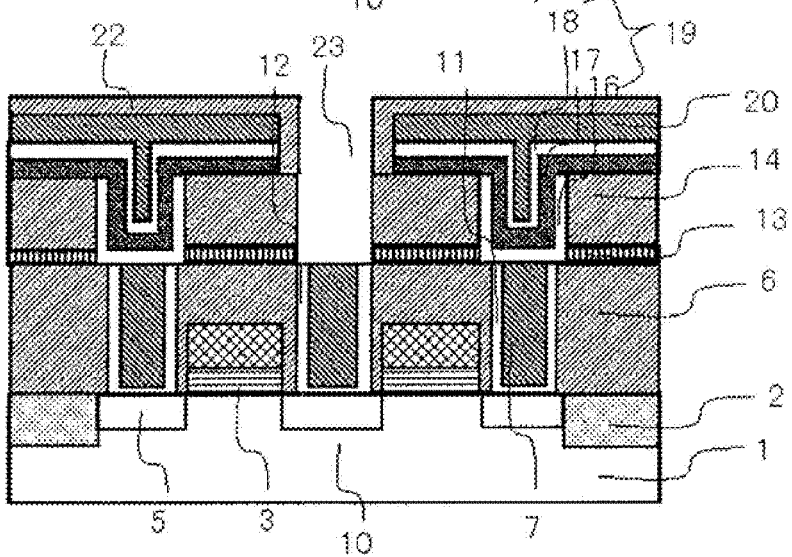
Figure 16:
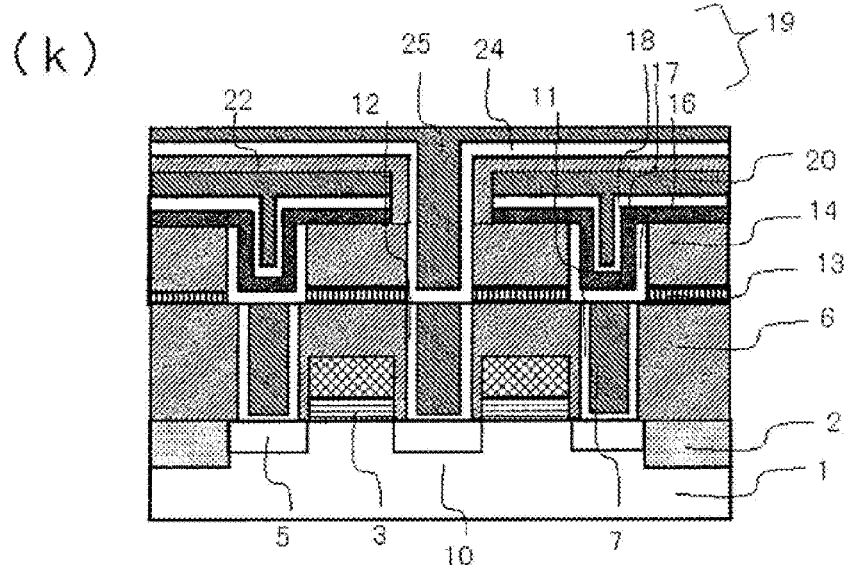
FIG. 16 is a figure showing a process of the manufacturing method of the semiconductor device of Example 3.

Next, Al(CH$_3$)$_3$ and Zr(NEt$_2$)$_4$ are simultaneously supplied. The Al material is supplied at a flow rate of 0.05 sccm under the control of the mass flow controller. Further, the Zr material is supplied by bubbling nitrogen gas at a flow rate of 20 sccm from a container at 80° C. At this time, the supply time of the material gas is 20 seconds. In the forming process of the ZrO$_2$ film, H$_2$O as the oxidizing agent is supplied onto the substrate. H$_2$O is supplied at a flow rate of 5 sccm for 2 seconds by the mass flow controller. Next, Zr(NEt$_2$)$_4$ is supplied. The Zr material is supplied by bubbling the nitrogen gas at a flow rate of 20 sccm from a container at 80° C. At this time, the supply time of the material gas is 20 seconds. At this time, the Al composition of the metal oxide layer according to the present invention can be controlled by the ratio of the number of film forming cycles (film thickness ratio) between the ZrAlO film and the ZrO$_2$ film. That is, a laminated film of ZrAlO and ZrO$_2$, which has a desired composition and thickness, can be formed by repeatedly performing a predetermined number of cycles of one set of the film forming processes, in which set, after the ZrAlO film is formed, the process of forming the ZrO$_2$ film is performed at N cycles. The Zr(1-x)Al$_x$O$_y$ film 206 having the Al composition of 5% and the thickness of 10 nm can be formed by repeatedly performing 10 cycles of one set of the film forming processes, in which set, after one cycle of the ZrAlO film forming process is performed, seven cycles of the ZrO$_2$ film forming process are performed. Note that the ZrAlO film forming process and the ZrO$_2$ film forming process can be suitably exchanged with each other, and the one set of the film forming processes may include a predetermined number of times of the ZrAlO film forming process and a predetermined number of times of the ZrO$_2$ film forming process. Further, the ZrAlO film forming process and the ZrO$_2$ film forming process may be performed by sputtering. FIG. 10 shows the dependency between the composition of the Zr(1-x)Al$_x$O$_y$ film 306 formed in the exemplary embodiment and the number of cycles of the ZrO$_2$ film forming process. The composition was evaluated by the XPS analysis. In this way, it is shown that the Al composition can be controlled in the wide range. Further, it was confirmed that even in the method in which the Zr material is not introduced in the ZrAlO film forming process, the Al composition can be controlled in a wide range by the number of cycles of the ZrO$_2$ film forming process.

By using the above described film forming process, there was formed a laminated film of ZrAlO and ZrO$_2$, having the Al composition in the range of $0 \leq x \leq 0.40$ and the film thickness in the range of 2 nm to 20 nm. Here, ZrO$_2$ with the Al composition of 0% represents the case where the supply process of the ZrAlO film is not performed in the film forming process shown in FIG. 9. Next, the laminated film was subjected to the anneal treatment in a nitrogen atmosphere at each of the temperatures of 400° C. and 600° C. for 10 minutes, so as to be formed into the Zr(1-x)Al$_x$O$_y$ film 306 with Al uniformly diffused into ZrO$_2$. Note that here, the anneal treatment was performed in the nitrogen atmosphere, but an inert gas, such as oxygen and Ar, can also be suitably used. Further, the anneal treatment may also be performed in an atmosphere selected from the group including these gases.

There was evaluated the relative dielectric constant of the Zr(1-x)Al$_x$O$_y$ film 306 manufactured as described above and having the Al composition in the range of $0 \leq x \leq 0.40$. As a result, it was found that the relative dielectric constant of the Zr(1-x)Al$_x$O$_y$ film 306 having the Al composition in the range of $0.01 \leq x \leq 0.15$ is larger than the relative dielectric constant of the ZrO$_2$ film having the Al composition of 0%, and exhibits a value in the range of 40 or more to 70 or less.

FIG. 5 shows the results of XRD diffraction evaluation of crystal phases of the ZrO$_2$ film and the Zr(1-x)Al$_x$O$_y$ film having the Al composition of 5%, each of which films was subjected to the anneal treatment at 600° C. It can be seen from FIG. 5 that there is no significant difference between the XRD spectra of the ZrO2 film and the Zr(1-x)Al$_x$O$_y$ film, and that there is no effect of the Al incorporation on the crystal phase of ZrO$_2$. The ZrO$_2$ film and the Zr(1-x)Al$_x$O$_y$ film 306 have a tetragonal structure. Thus, it can be seen that the effect of improving the characteristics by the Al incorporation is not based on the change of crystal phase.

Further, in the Zr(1-x)Al$_x$O$_y$ film subjected to the anneal treatment at 400° C., there were obtained the range of the relative dielectric constant and the XRD spectrum which are the same as those of the Zr(1-x)Al$_x$O$_y$ film subjected to the anneal treatment at 600° C.

Example 2

Example 2 will be described in detail with reference to the accompanying drawings.

By using the same process as that in Example 1, a Zr(1-x)Al$_x$O$_y$ film having the Al composition in the range of $0 \leq x \leq 0.40$ and the film thickness of 2 nm to 20 nm was formed on a silicon substrate 104 and subjected to the anneal treatment in a nitrogen atmosphere at each of the temperatures of 400° C. and 600° C. Note that here, the anneal treatment was performed in the nitrogen atmosphere, but an inert gas, such as Ar, can also be suitably used. Further, the anneal treatment may also be performed in an atmosphere selected from the group including these gases. Then, a capacitor was formed by depositing Ti onto the Zr(1-x)Al$_x$O$_y$ film in a film thickness of 100 nm by a vacuum deposition method. Here, it is assumed that the silicon substrate is a first electrode, and that the Ti is a second electrode.

The EOT of the element was evaluated by the CV measurement performed by applying a voltage to the first electrode, with a result that EOT=1.3 nm.

Next, the electrical characteristics of the capacitors were measured. In consideration of the influence of the surface potential on the I-V characteristic due to the difference in the film thickness of the insulating film, the measurement was performed by measuring the leakage current at the time when a voltage of (Vfb-1) V was applied to the upper electrode on the basis of a flat band voltage (Vfb) obtained from the CV characteristic of the MIS structure. FIG. 3 shows the measurement results of the electrical characteristics. The EOT of the element is a value obtained by including the natural oxide film. In FIG. 3, when the characteristics obtained after the anneal treatment at 600° C. are compared with each other, it can be seen that the leakage current of the $ZrO_2$ film having the Al composition of 0% is $1.5 \times 10^{-5}$ A/cm$^2$, while the leakage current of the Zr(1−x)AlxOy film having the Al composition in the range of $0.01 \leq x \leq 0.15$ is smaller than the leakage current of the $ZrO_2$ film not containing Al. In particular, it can be seen that the leakage current of the Zr(1−x)AlxOy film having the Al composition in the range of $0.02 \leq x \leq 0.10$ has a value of $1.0 \times 10^{-8}$ A/cm$^2$ or less and is lower by three digits or more than the leakage current of the $ZrO_2$ film not containing Al.

Next, when in FIG. 6, the characteristics after the annealing treatment at 400° C. are compared with each other, it can be seen that the leakage current of the $ZrO_2$ film having the Al composition of 0% is $1.0 \times 10^{-5}$ A/cm$^2$ and is substantially the same as the characteristic obtained after the anneal treatment at 600° C., while the leakage current of the Zr(1−x)AlxOy film having the Al composition in the range of $0.01 \leq x \leq 0.08$ is smaller than the leakage current of the $ZrO_2$ film not containing Al. In particular, it can be seen that the leakage current of the Zr(1−x)AlxOy film having the Al composition in the range of $0.02 \leq x \leq 0.05$ has a value of $1.0 \times 10^{-8}$ A/cm$^2$ or less and is lower by three digits or more than the leakage current of the $ZrO_2$ film not containing Al.

It is considered that the difference in the leakage current reducing effect between the annealing temperatures in FIG. 6 reflects the difference in the crystallization temperature of the Zr(1−x)AlxOy film. In the case of the annealing temperature of 600° C., the Zr(1−x)AlxOy film having the Al composition in the range of $0.01 \leq x \leq 0.15$ is crystallized, so that the leakage current reducing effect is obtained. In the case of the annealing temperature of 400° C., the Zr(1−x)AlxOy film having the Al composition in the range of $0.01 \leq x \leq 0.08$ is crystallized, so that the leakage current reducing effect is obtained. In this way, the optimum Al composition range for obtaining the leakage current reducing effect is associated with the crystallization temperature by the annealing.

As can be seen from the above, according to the element of Example 2, the physical film thickness of the element can be increased as compared with the $ZrO_2$ film having a film thickness corresponding to the same EOT as that of the element, so that it is possible to obtain a semiconductor device whose leakage current is reduced.

Further, in Example 2, Ti was used as the upper electrode. However, it was confirmed that the same effect can be obtained even when a material selected from a group including TiN, W, WN, Pt, Ir and Ru is used as the upper electrode.

Further, in Example 2, a silicon substrate having a natural oxide film on the surface thereof was used as the substrate. However, it was confirmed that the same effect can be obtained even when a substrate having, on the surface thereof, a metal of TiN, Ti, W, WN, Pt, Ir and Ru, or a nitride of the metals, is used as the substrate.

The above effects were similarly obtained in the capacitor using the Zr(1−x)AlxOy film as the best mode for carrying out the present invention (hereinafter referred to as first exemplary embodiment 1).

Example 3

Example 3 will be described in detail with reference to the accompanying drawings.

FIG. 11 to FIG. 16 show a process chart of a manufacturing method of a semiconductor device as Example 3. As shown in FIG. 11(a), element isolation regions 2 were formed in a surface area of a P-type silicon substrate 1 by a LOCOS (Local Oxidation of Silicon) method or an STI (Shallow Trench Isolation) method. Next, a silicon oxide film and a polycrystalline silicon film are successively formed in the active region surrounded by the element isolation regions 2. These laminated films are processed into desired shapes by using a lithography technique and an RIE (Reactive Ion Etching) technique, so that gate oxide films 3 and gate electrodes 4 are formed. Next, ion implantation is performed by using the gate oxide films 3 and the gate electrodes 4 as a mask, so as to introduce N-type impurity to the silicon substrate 1. Thereby, a plurality of N-type diffusion regions 5 serving as the source region or the drain region are formed in a self-aligned manner. Next, a first interlayer insulating film 6 made of a silicon oxide film is formed on the whole surface by the CVD method. Thereby, there are formed memory selection transistors 10 configured by MOS transistors. Here, the diffusion region 5 configuring the source region or the drain region may have an LDD (Lightly Doped Drain) structure formed by combining a high impurity region and a low impurity region, or may have a non-LDD structure formed by a high impurity concentration region. Further, a silicide layer may be formed in the source and drain regions by a salicide method. At this time, as the silicide layer, Ni silicide, Co silicide, or Ti silicide may be used from the viewpoint of contact resistance.

Next, the first interlayer insulating film 6 is selectively etched by using a photolithography method so that contact holes 7 are formed so as to expose the diffusion regions.

Next, as shown in FIG. 11(b), a TiN film 8 is formed as a barrier metal on the whole surface by the CVD method or a PVD method, and then a W (tungsten) film 9 is formed on the whole surface by the CVD method. Thereafter, unnecessary portions of the TiN film 8 and the W film 9 are removed by flattening the surface of the first interlayer insulating film 6 by a CMP (Chemical Mechanical Polishing) method, so that capacitive contacts 11 and a bit contact 12 are formed in the contact holes 7 so as to be respectively connected to the diffusion regions 5.

Next, as shown in FIG. 12(c), a stopper insulating film 13 made of an oxynitriding silicon (SiON) film and a second interlayer insulating film 14 made of a silicon oxide film are formed on the whole surface by the CVD method.

Next, as shown in FIG. 12(d), cylinder grooves 15 are formed by selectively etching the second interlayer insulating film 14 by using the photolithography method, so that the capacitive contacts 11 are exposed.

Next, a first electrode made of a TiN film having a thickness of 20 nm to 40 nm is formed in each of the cylinder grooves by using the CVD method or the ALD method. Thereafter, as shown in FIG. 13(e), unnecessary portions of the first electrodes are removed by the photolithography method, so that first electrodes 16 are formed by the electrode films left in the capacitive contacts 11.

Next, as shown in FIG. 13(f), a capacitor dielectric film 17 is formed on the first electrode by the ALD method or the CVD method. Here, similarly to Example 1, the dielectric film was formed by using the film forming sequence as shown in FIG. 5. The formed Zr(1−x)AlxOy film has the composition in the range of $0 \leq x \leq 0.40$. Further, the formed dielectric film has the thickness in the range of 2 nm to 20 nm. Further, after being formed, the dielectric film was subjected to the anneal treatment in a nitrogen atmosphere at a temperature of 600° C. for 10 minutes. Note that here, the anneal treatment was performed in the nitrogen atmosphere, but inert gas, such as Ar, can also be suitably used. Here, in order to suppress the oxidization of the first electrode, it is desirable to use nitrogen, inert gas, and the like.

Next, as shown in FIG. 14(g), a second electrode 18 made of a TiN film is formed by using the CVD method or the ALD method. Thereby, there are formed MIM structure capacitors 19 each of which is configured by the first electrode 16, the dielectric film 17, and the second electrode 18. From the viewpoint of securing the capacitance value, the capacitor structure of the DRAM capacitor section preferably has a large surface area structure like a cylinder-like structure that is configured, as in Example 3, in such a manner that the surface of the first electrode 16 which surface faces the second electrode 18, and the surface of the second electrode 18 which surface faces the first electrode 16, respectively include a surface substantially in parallel with the substrate and a surface substantially vertical to the substrate. That is, it is preferred that each of mutually facing surfaces of electrodes forming a capacitor is configured by a plurality of surfaces.

Next, as shown in FIG. 14(h), a capacitor wire 20 made of a W film is formed on the whole surface by the CVD method, so as to be connected to the first electrode 18 of the capacitor 19. Next, as shown in FIG. 15(i), an opening section 21 is formed so as to expose the second interlayer insulating film 14 above the bit contact 12.

Next, as shown in FIG. 15(j), after a third interlayer insulating film 22 made of a silicon oxide film is formed on the whole surface by the CVD method, the third interlayer insulating film 22 is selectively etched by using the photolithography method, and thereby a contact hole 23 is formed inside the opening section 21 so as to expose the bit contact 12.

Next, as shown in FIG. 16(k), a TiN film 24 as a barrier metal is formed on the whole surface by the CVD method. Then, a bit wire 25 made of a W film is formed on the whole surface by using the CVD method so as to be connected to the bit contact 12. Thereby, a semiconductor device is completed.

It was confirmed that in the semiconductor device of Example 3, when the dielectric film made of $Zr(1-x)Al_xO_y$ having the Al composition in the range of $0.01 \leq x \leq 0.15$ is used as the dielectric film of the capacitor, the relative dielectric constant is increased as compared with the dielectric film made of $ZrO_2$ having the Al composition of 0%, so that the leakage current is reduced as compared with the $ZrO_2$ film having the same EOT as that of the $Zr(1-x)Al_xO_y$ film. In particular, it was confirmed that in the case where the upper limit of the Al composition is set in the range of $x \leq 0.10$ and where the lower limit of the Al composition is set in the range of $0.02 \leq x$, the leakage current is significantly reduced, so as to provide a margin in the range of the Al composition. Further, it was confirmed that the $Zr(1-x)Al_xO_y$ film having the Al composition in the range of $0.01 \leq x \leq 0.15$ is crystallized and has the same tetragonal structure as that of the $ZrO_2$ film.

As described above, even when the dielectric film of Example 1 is used as the capacitance insulating film of the capacitor having the cylinder-like structure, it is possible to obtain the effect of the dielectric film.

In Example 3, a MOS transistor was used as the switching element, but an element, such as the other field-effect transistor, which functions as the switching element, can be suitably selected and used.

Further, in Example 3, TiN was used as the first electrode and the second electrode. However, it was confirmed that the same effect can be obtained even when there is used, as the first electrode, one material selected from a group including Ti, W, WN, Pt, Ir and Ru. Further, it was confirmed that the same effect can be obtained even when there is used, as the second electrode, one material selected from a group including Ti, W, WN, Pt, Ir and Ru.

Example 4

Example 4 will be described in detail with reference to the accompanying drawings.

Figure 17:
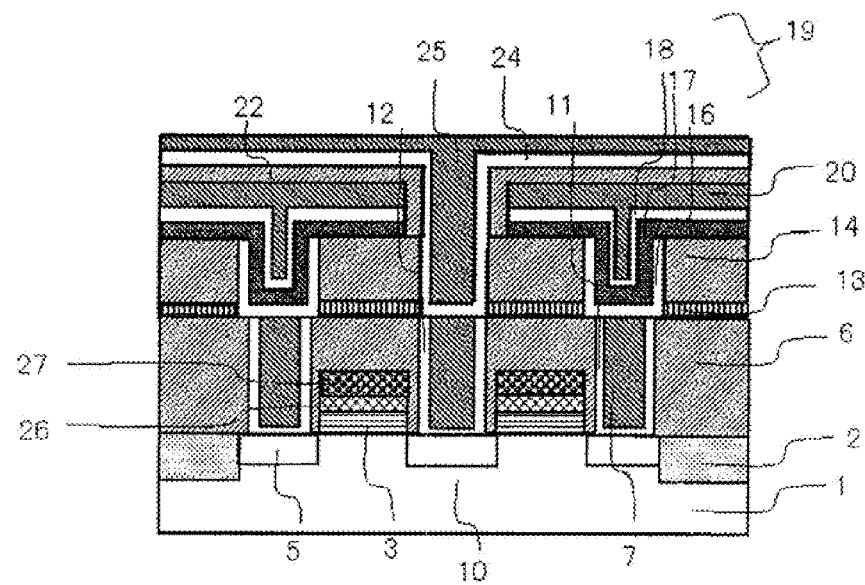
FIG. 17 is a figure showing a cross-sectional structure of a semiconductor device of Example 4.

FIG. 17 is a figure showing a cross-sectional structure of a semiconductor device as Example 4. Example 4 is different from Example 3 in that the gate electrode of the transistor in Example 3 is formed by a layer 26 made of polycrystalline silicon containing n-type impurity, and a layer 27 made of tungsten. The gate electrode forming process and the processes subsequent to the gate electrode forming process are the same as the processes in Example 3.

It was confirmed that in the semiconductor device according to the present invention, when the dielectric film made of $Zr(1-x)Al_xO_y$ having the Al composition in the range of $0.01 \leq x \leq 0.15$ is used as the dielectric film of the capacitor, the relative dielectric constant is increased as compared with the dielectric film made of $ZrO_2$ having the Al composition of 0%, so that the leakage current is reduced as compared with the $ZrO_2$ film having the same EOT as that of the $Zr(1-x)Al_xO_y$ film. In particular, it was confirmed that when the upper limit of the Al composition is set in the range of $x \leq 0.10$ and the lower limit of the Al composition is set in the range of $0.02 \leq x$, the leakage current is significantly reduced, so as to provide a margin in the range of the Al composition. Further, it was confirmed that the $Zr(1-x)Al_xO_y$ film having the composition in the range of $0.01 \leq x \leq 0.15$ is crystallized and has the same tetragonal structure as that of the $ZrO_2$ film.

Further, in Example 4, there was used, as the gate electrode, the laminated structure of the polycrystalline silicon containing n-type impurity, such as boron and arsenic, and tungsten. However, it was confirmed that the same effect can be obtained even when tungsten nitride, tungsten silicide, nickel silicide, cobalt silicide, or the like, is used instead of tungsten.

Further, the diffusion region 5 configuring the source region or the drain region may have an LDD (Lightly Doped Drain) structure formed by combining a high impurity region and a low impurity region, or may have a non-LDD structure formed by a high impurity concentration region. Further, a silicide layer may also be formed in the source and drain regions by the salicide method. At this time, Ni silicide, Co silicide, or Ti silicide may be used as the silicide layer from the viewpoint of contact resistance.

In Example 4, a MOS transistor was used as the switching element, but an element, such as the other field-effect transistor, which functions as the switching element, can be suitably selected and used.

Further, in Example 4, TiN was used as the first electrode and the second electrode, but it was confirmed that the same effect can be obtained even when there is used, as the first electrode, one material selected from a group including Ti, W, WN, Pt, Ir and Ru. Further, it was confirmed that the same effect can be obtained even when there is used, as the second electrode, one material selected from a group including Ti, W, WN, Pt, Ir and Ru.

Example 5

Example 5 will be described in detail with reference to the accompanying drawings.

Figure 18:
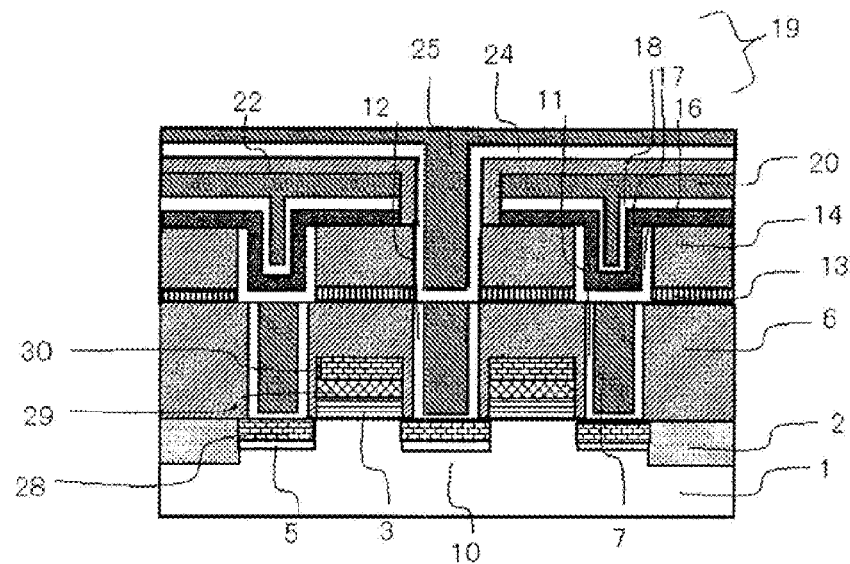
FIG. 18 is a figure showing a cross-sectional structure of a semiconductor device of Example 5.

FIG. 18 is a figure showing a cross-sectional structure of a semiconductor device as Example 5. Example 5 is different from Example 3 and Example 4 in that a nickel silicide layer 28 is used in a portion of the source and drain diffusion regions of the transistor in Example 3 and Example 4, and in that the gate electrode is formed by a layer 29 made of polycrystalline silicon containing n-type impurity, such as boron and arsenic, and by a layer 30 made of nickel silicide. The gate electrode forming process and the processes subsequent to the gate electrode forming process are the same as the processes in Example 3, except the difference in the annealing temperature of the dielectric film. Here, in the annealing process of the dielectric film, the treatment was performed in a nitrogen atmosphere at 400° C. for 10 minutes. Note that the anneal treatment was performed in the nitrogen atmosphere here, but inert gas, such as Ar, can also be suitably used. In order to suppress oxidization of the first electrode, it is desirable here to use nitrogen, inert gas, or the like.

It was confirmed that in the semiconductor device according to the present invention, when the dielectric film made of Zr(1−x)AlxOy having the Al composition in the range of $0.01 \leq x \leq 0.08$ is used as the dielectric film of the capacitor, the relative dielectric constant is increased as compared with the dielectric film made of $ZrO_2$ having the Al composition of 0%, so that the leakage current is reduced as compared with the $ZrO_2$ film having the same EOT as that of the Zr(1−x)AlxOy film. In particular, it was confirmed that when the upper limit of the Al composition is set in the range of $x \leq 0.05$ and the lower limit of the Al composition is set in the range of $0.02 \leq x$, the leakage current is significantly reduced so as to provide a margin in the range of the Al composition. Further, it was confirmed that the Zr(1−x)AlxOy film having the Al composition in the range of $0.01 \leq x \leq 0.08$ is crystallized and has the same tetragonal structure as that of the $ZrO_2$ film.

Further, the element characteristics were not lowered due to the deterioration of the Ni silicide region of the source and drain regions in the transistor section.

Further, in Example 5, Ni silicide was used in a portion of the source and drain regions and the gate electrode, but it was confirmed that the same effect can also be obtained even when Co silicide or a silicide layer made of a compound of Ni and Pt is used instead of Ni silicide.

In Example 5, a MOS transistor was used as the switching element, but an element, such as the other field-effect transistor, which functions as the switching element, can be suitably selected and used.

Further, in Example 5, TiN was used as the first electrode and the second electrode, but it was confirmed that the same effect can be obtained even when there is used, as the first electrode, one material selected from a group including Ti, W, WN, Pt, Ir and Ru. Further, it was confirmed that the same effect can be obtained even when there is used, as the second electrode, one material selected from a group including Ti, W, WN, Pt, Ir and Ru.

As described above, the capacitance insulating film according to the present invention can be manufactured by heat treatment at 400° C. This prevents the deterioration of the metal silicide region in the transistor section, which deterioration may be caused at the time of annealing at a temperature higher than 600° C.

Example 6

Example 6 will be described in detail with reference to the accompanying drawings.

Figure 19:
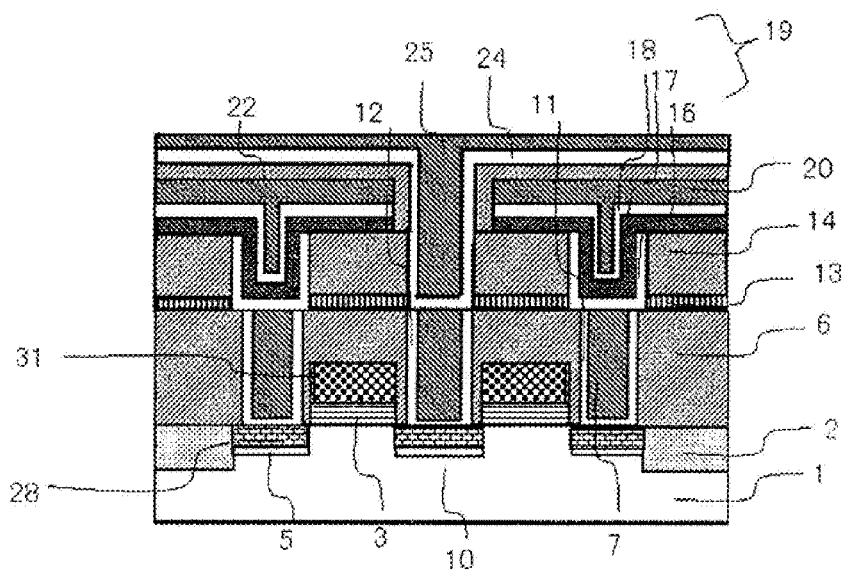
FIG. 19 is a figure showing a cross-sectional structure of a semiconductor device of Example 6.

FIG. 19 is a figure showing a cross-sectional structure of a semiconductor device as Example 6. Example 6 is different from Example 5 in that the gate electrode of the transistor in Example 5 is formed by a layer 31 made of Ni silicide. The gate electrode forming process and the processes subsequent to the gate electrode forming process are the same as the processes in Example 5.

It was confirmed that in the semiconductor device according to the present invention, when the dielectric film made of Zr(1−x)AlxOy having the Al composition in the range of $0.01 \leq x \leq 0.08$ is used as the dielectric film of the capacitor, the relative dielectric constant is increased as compared with the dielectric film made of $ZrO_2$ having the Al composition of 0%, so that the leakage current is reduced as compared with the $ZrO_2$ film having the same EOT as that of the Zr(1−x)AlxOy film. In particular, it was confirmed that when the upper limit of the Al composition is set in the range of $x \leq 0.05$ and the lower limit of the Al composition is set in the range of $0.02 \leq x$, the leakage current is significantly reduced so as to provide a margin in the range of the Al composition. Further, it was confirmed that the Zr(1−x)AlxOy film having the Al composition in the range of $0.01 \leq x \leq 0.08$ is crystallized and has the same tetragonal structure as that of the $ZrO_2$ film.

Further, the element characteristics were not lowered due to the deterioration of the Ni silicide region of the gate electrode and the source and drain regions in the transistor section.

In Example 6, a MOS transistor was used as the switching element, but an element, such as the other field-effect transistor, which functions as the switching element, can be suitably selected and used.

Further, in Example 6, TiN was used as the first electrode and the second electrode, but it was confirmed that the same effect can be obtained even when there is used, as the first electrode, one material selected from a group including Ti, W, WN, Pt, Ir and Ru. Further, it was confirmed that the same effect can be obtained even when there is used, as the second electrode, one material selected from a group including Ti, W, WN, Pt, Ir and Ru.

As described above, the capacitance insulating film according to the present invention can be manufactured by heat treatment at 400° C. or less. This prevents the deterioration of the metal silicide region in the transistor section, which deterioration may be caused at the time of annealing at a temperature higher than 600° C.

Example 7

Example of MOSFET Corresponding to Example 6

Example 7 will be described in detail with reference to the accompanying drawings.

Figure 20:
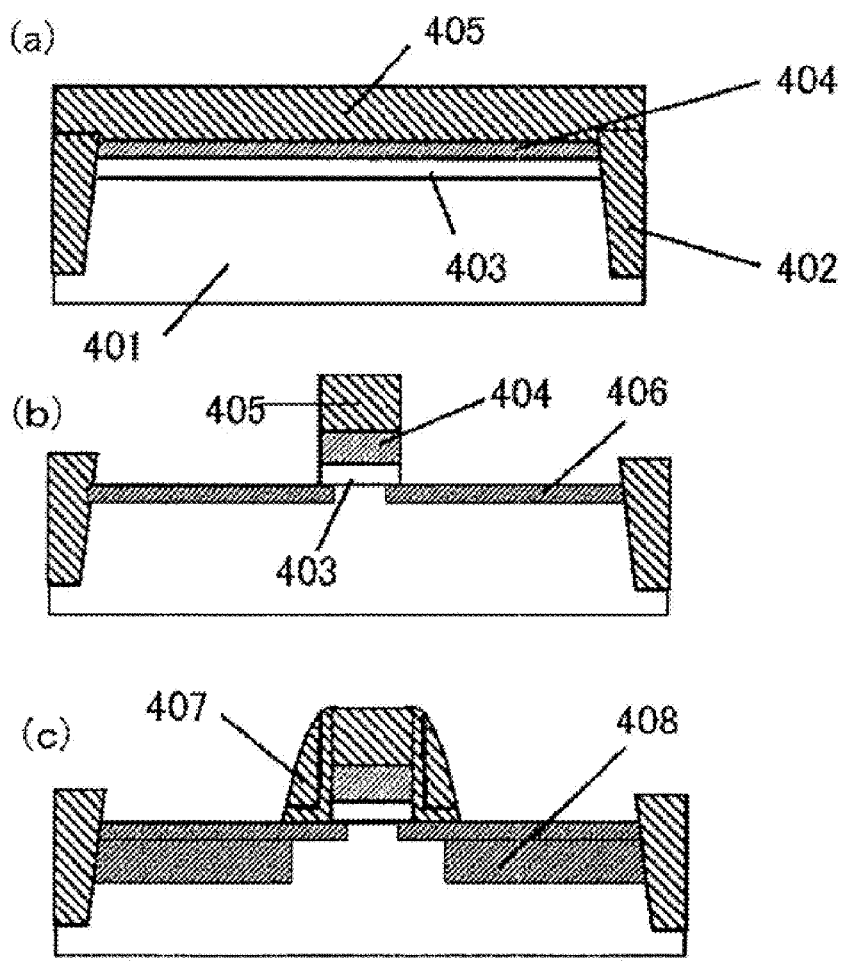
FIG. 20 is a figure showing a process of a manufacturing method of a semiconductor device of Example 7.

FIGS. 20(a) to 20(c) are figures showing a process of a manufacturing method of a semiconductor device as Example 7. First, as shown in FIG. 20(a), element isolation regions 402 were formed on the surface of a silicon substrate 401 by using the STI (Shallow Trench isolation) technique. Subsequently, a silicon thermal oxide film 403 having a film thickness of 1.9 nm is formed on the element-isolated silicon substrate surface by a thermal oxidation method. Thereafter, a Zr(1−x)AlxOy film 404 is formed in the thickness of 1 to 10 nm by the same method as in Example 1. Subsequently, the anneal treatment is performed at 600° C. in an $N_2$ atmosphere for 10 minutes, so that the Zr(1−x)AlxOy film is crystallized.

Next, after polysilicon 405 having a thickness of 150 nm was formed on the Zr(1−x)AlxOy film 404, the polysilicon 405 was processed into a gate electrode as shown in FIG. 20(b) by using the lithography technique and the RIE (Reactive Ion Etching) technique, and an extension diffusion layer region 406 was subsequently formed in a self-aligned manner by performing ion implantation using the gate electrode as a mask.

Further, as shown in FIG. 20(c), a silicon nitride film and a silicon oxide film were successively deposited, and then a gate side wall 407 was formed by performing etch back. The ion implantation was again performed in this state, and source and drain diffusion layers 408 were formed through activation annealing.

As a result of evaluation of the electrical characteristics of the manufactured element, it was confirmed that the leakage current of the element using the Zr(1−x)AlxOy film having the Al composition in the range of $0.01 \leq x \leq 0.15$ can be reduced as compared with the element using the $ZrO_2$ film having the Al composition of 0% and having the same EOT as that of the element made of Zr(1−x)AlxOy. In this way, in the semiconductor device of Example 7, when the crystallized Zr(1−x)AlxOy film having the Al composition in the range of $0.01 \leq x \leq 0.15$ is used as a portion of the gate insulating film of a MOSFET, it is possible to reduce the gate leakage current.

The invention claimed is:

1. A composite oxide dielectric mainly composed of Zr, Al and O, wherein a composition ratio of Zr and Al is set in a range of (1−x):x where $0.01 \leq x \leq 0.15$, and having a crystal structure.

2. The dielectric according to claim 1, wherein the composition of Zr, Al and O is set as Zr(1−x)AlxOy where $0.01 \leq x \leq 0.15$ and $1 \leq y \leq 2-0.5x$.

3. The dielectric according to claim 1, wherein the composition of Zr, Al and O is set as Zr(1−x)AlxOy where $0.02 \leq x \leq 0.10$, $1 \leq y \leq 2-0.5x$.

4. The dielectric according to claim 1, wherein the composition of Zr, Al and O is set as Zr(1−x)AlxOy where $0.02 \leq x \leq 0.05$, $1 \leq y \leq 2-0.5x$.

5. The dielectric according to claim 1, wherein the composition ratio of the sum of Zr and Al to the total of metallic elements in the dielectric is 99% or more.

6. The dielectric according to claim 1, wherein the composition ratio of O to the total of elements except metal elements in the dielectric is 80% or more.

7. The dielectric according to claim 1, wherein the relative dielectric constant is higher than the relative dielectric constant of a crystal of $ZrO_2$.

8. The dielectric according to claim 1, wherein the relative dielectric constant is 40 or more.

9. A capacitor including a first electrode, a second electrode, and a dielectric sandwiched between the first electrode and the second electrode, wherein the dielectric is the dielectric according to claim 1.

10. The capacitor according to claim 9, wherein the dielectric has a film thickness of 2 nm or more to 20 nm or less.

11. The capacitor according to claim 10, wherein in a dielectric film thickness corresponding to an $SiO_2$ equivalent film thickness of 1.3 nm or less, the leakage current that flows between the first electrode and the second electrode at the time when the potential difference between the first electrode and the second electrode is set to (Vfb−1) V on the basis of flat band voltage of Vfb, is $1 \times 10^{-8}$ A/cm$^2$ or less.

12. The capacitor according to claim 9, wherein the first electrode is made of a material selected from a group including TiN, Ti, W, Pt, Ir and Ru, and the second electrode is made of a material selected from a group including TiN, Ti, W, Pt, Ir and Ru.

13. The capacitor according to claim 12, wherein in a dielectric film thickness corresponding to an $SiO_2$ equivalent film thickness of 0.6 nm or less, the leakage current that flows between the first electrode and the second electrode at the time when the potential difference between the first electrode and the second electrode is set to 1V, is $1 \times 10^{-8}$ A/cm$^2$ or less.

14. A semiconductor device including a dielectric as an insulating body, wherein the dielectric is the dielectric according to claim 1.

15. A semiconductor device including a capacitor, wherein the capacitor is the capacitor according to claim 9.

16. The semiconductor device according to claim 15, further comprising a switching element formed on a substrate whose surface at least is formed by a semiconductor layer, wherein the switching element is electrically connected to the capacitor.

17. The semiconductor device according to claim 15, wherein the surface of the first electrode, whose surface faces the second electrode, and the surface of the second electrode, whose surface faces the first electrode, are respectively configured by a plurality of surfaces.

18. The semiconductor device according to claim 17, wherein the surface of the first electrode, whose surface faces the second electrode, is configured by a surface substantially in parallel with the substrate and a surface substantially vertical to the substrate, and the surface of the second electrode, whose surface faces the first electrode, is configured by a surface substantially in parallel with the substrate and a surface substantially vertical to the substrate.

19. A semiconductor device including a source region and a drain region on a substrate whose surface at least is formed by a semiconductor layer, and a gate electrode formed on the substrate via an insulating film, wherein the insulating film is a film including a thin film made of the dielectric according to claim 1.

20. A manufacturing method of a composite oxide dielectric mainly composed of Zr, Al and O and having a composition ratio of Zr and Al in a range of (1−x):x where $0.01 \leq x \leq 0.15$ and a crystalline structure, the manufacturing method comprising: a first process of forming a precursor by depositing a film mainly composed of Zr, Al and O onto a substrate; and a second process of forming the precursor into the dielectric by heat-treating the precursor.

21. The manufacturing method of the dielectric according to claim 20, wherein the first process is performed by sputtering.

22. The manufacturing method of the dielectric according to claim 20, wherein the first process is performed by an atomic layer deposition method or a chemical vapor deposition method.

23. The manufacturing method of dielectric according to claim 20, wherein the first process includes a process a of forming an oxide layer mainly composed of Zr and Al, and a process b of forming an oxide layer mainly composed of Zr.

24. The manufacturing method of the dielectric according to claim 23, comprising: a predetermined number of times of the process a; and a predetermined number of times of the process b.

25. The manufacturing method of the dielectric according to claim 23, wherein the layer formed by the process a and the layer formed by the process b are made uniform in composition by the second process.

26. The manufacturing method of the dielectric according to claim 20, wherein the second process is performed by heat treatment at 350° C. or more.

27. The manufacturing method of the dielectric according to claim 20, wherein the second process is performed by the heat treatment in an atmosphere of one of oxygen, nitrogen, and inert gas, or in a mixed gas atmosphere of the gases.

* * * * *